United States Patent
Chen et al.

(10) Patent No.: US 11,670,668 B2
(45) Date of Patent: Jun. 6, 2023

(54) LIGHT-EMITTING DEVICE

(71) Applicants: Kuan-Yu Chen, Taoyuan (TW);
Hsiao-Lung Lin, New Taipei (TW);
Hao-Hsiang Huang, Taoyuan (TW)

(72) Inventors: Kuan-Yu Chen, Taoyuan (TW);
Hsiao-Lung Lin, New Taipei (TW);
Hao-Hsiang Huang, Taoyuan (TW)

( * ) Notice: Subject to any disclaimer, the term of this patent is extended or adjusted under 35 U.S.C. 154(b) by 188 days.

(21) Appl. No.: 17/199,445

(22) Filed: Mar. 12, 2021

(65) Prior Publication Data

US 2021/0288106 A1   Sep. 16, 2021

(30) Foreign Application Priority Data

Mar. 13, 2020   (TW) ................................. 109108486

(51) Int. Cl.
| | | |
|---|---|---|
| *H01L 27/15* | (2006.01) | |
| *H01L 33/56* | (2010.01) | |
| *H01L 33/54* | (2010.01) | |

(52) U.S. Cl.
CPC ............ *H01L 27/156* (2013.01); *H01L 33/54* (2013.01); *H01L 33/56* (2013.01)

(58) Field of Classification Search
CPC ........ H01L 27/156; H01L 33/54; H01L 33/56
See application file for complete search history.

(56) References Cited

U.S. PATENT DOCUMENTS

| | | | |
|---|---|---|---|
| 10,490,536 | B2 | 11/2019 | Wu et al. |
| 2005/0104081 | A1* | 5/2005 | Kim ...................... H01L 33/382 |
| | | | 257/E33.068 |
| 2019/0189598 | A1 | 6/2019 | Singer et al. |
| 2019/0302917 | A1* | 10/2019 | Pan ...................... H01L 27/1266 |
| 2020/0066787 | A1* | 2/2020 | Park ...................... H01L 27/156 |

FOREIGN PATENT DOCUMENTS

| | | |
|---|---|---|
| CN | 104465915 | 3/2015 |
| CN | 109545094 | 3/2019 |
| CN | 110783438 | 2/2020 |
| TW | 201240170 | 10/2012 |

* cited by examiner

*Primary Examiner* — Jay C Chang
*Assistant Examiner* — Mikka Liu
(74) *Attorney, Agent, or Firm* — JCIPRNET

(57) ABSTRACT

A light-emitting device including a substrate, an insulating layer, an inner circuit structure, a plurality of light-emitting elements, an insulating encapsulation layer, and a transparent conductive layer is provided. The insulating layer is disposed on the substrate. The inner circuit structure is disposed on the insulating layer. The light-emitting elements are correspondingly disposed on the inner circuit structure. The insulating encapsulation layer is disposed on the inner circuit structure. The insulating encapsulating layer covers a portion of the inner circuit structure and encapsulates the light-emitting elements. The transparent conductive layer is disposed on the insulating encapsulating layer. The transparent conductive layer electrically connects the light-emitting elements, and serially connects the light-emitting elements.

10 Claims, 9 Drawing Sheets

LIGHT-EMITTING DEVICE

CROSS-REFERENCE TO RELATED APPLICATION

This application claims the priority benefit of Taiwan application serial no. 109108486, filed on Mar. 13, 2020. The entirety of the above-mentioned patent application is hereby incorporated by reference herein and made a part of this specification.

BACKGROUND

Technical Field

The invention relates to a light-emitting device.

Description of Related Art

Along with advancement of manufacturing technology, light-emitting diodes (LED) have gradually enhanced their light-emitting efficiency and brightness through continuous research and development, and improvement, so as to expand and adapt to the needs of various products. However, under the pursuit of reducing the size and volume of the LED, and increasing power and working current of the LED, the LED may generate more heat, which affects its performance.

In addition, the sizes of mini LED or micro LED are very small. Therefore, electrical anomalies are likely to occur during die bonding process and/or wire bonding process, thereby increasing process difficulty and reducing process yield of manufacturing the light-emitting device. In addition, since the wire bonding process requires an additional wiring space to dispose electrodes, layout density of the LEDs cannot be further improved. Therefore, how to improve the heat dissipation efficiency of the light-emitting device and increase the process yield is an urgent issue required to be resolved in the field.

SUMMARY

The invention is directed to a light-emitting device, which has reduced manufacturing process difficulty, improved manufacturing process yield, and good heat dissipation efficiency.

The invention provides a light-emitting device including a substrate, an insulating layer, an inner circuit structure, a plurality of light-emitting elements, an insulating encapsulation layer, and a transparent conductive layer. The insulating layer is disposed on the substrate. The inner circuit structure is disposed on the insulating layer. The light-emitting elements are correspondingly disposed on the inner circuit structure. The insulating encapsulation layer is disposed on the inner circuit structure, and the insulating encapsulation layer covers a portion of the inner circuit structure and encapsulates the light-emitting elements. The transparent conductive layer is disposed on the insulating encapsulation layer. The transparent conductive layer electrically connects the light-emitting elements, and serially connects the light-emitting elements.

Based on the above description, in the light-emitting device according to an embodiment of the invention, the light-emitting elements may be directly electrically connected to the inner circuit structure. Then, the light-emitting elements are encapsulated and fixed on the inner circuit structure through the insulating encapsulation layer. The transparent conductive layer electrically and serially connects the light-emitting elements. In this way, the light-emitting device may avoid the problem of electrical anomaly due to excessive smallness of LED electrodes. In addition, the light-emitting device of the embodiment directly encapsulates the light-emitting elements in the insulating encapsulation layer and fixes the same to the inner circuit structure, thereby reducing the manufacturing process difficulty and improving the manufacturing yield. Moreover, besides providing good heat dissipation efficiency, a metal material substrate of the light-emitting device of the embodiment may also provide toughness and structural reliability.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
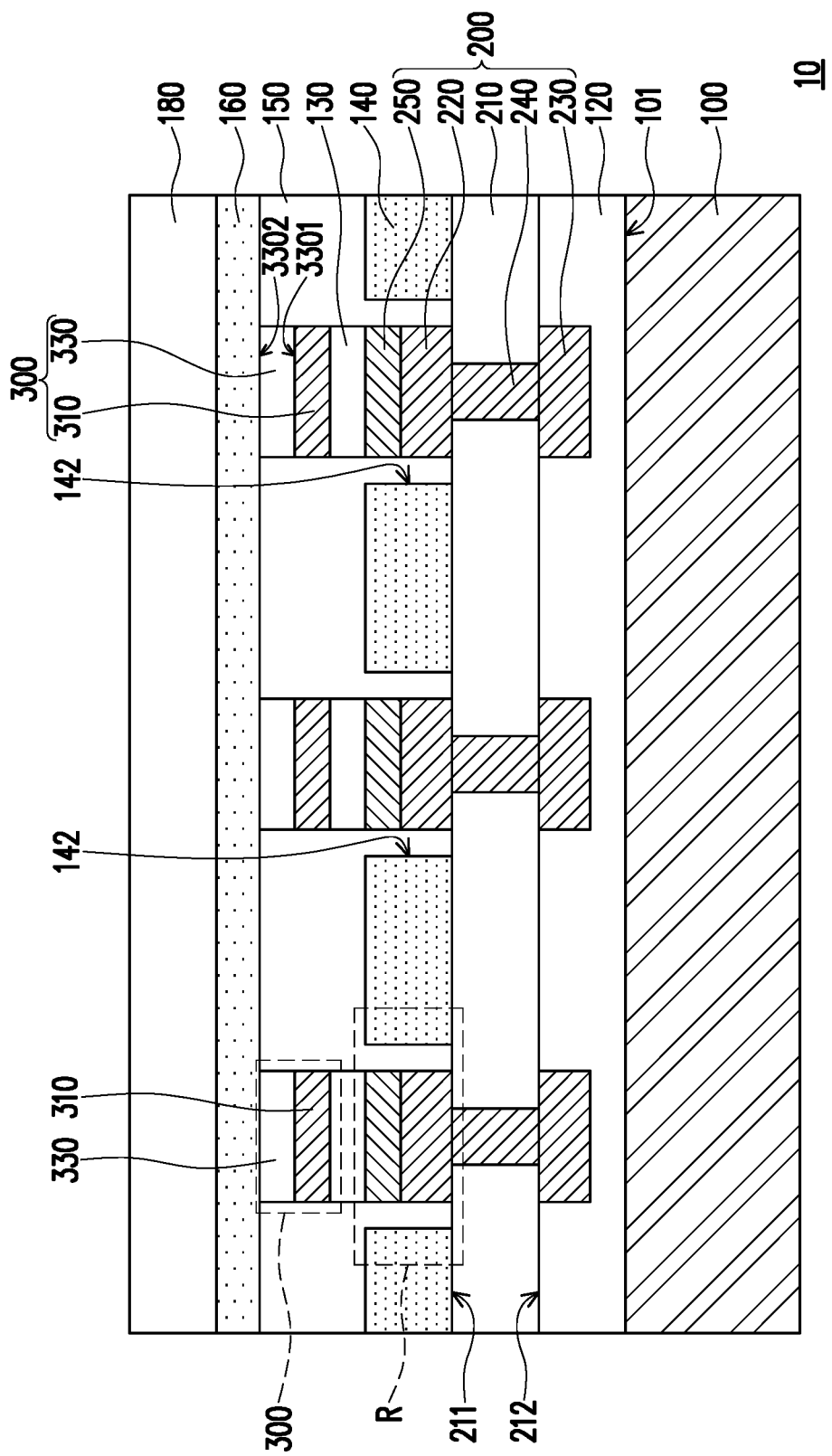
FIG. 1 is a schematic cross-sectional view of a light-emitting device according to an embodiment of the invention.

The invention may be explained more fully with reference to the drawings of the embodiments. However, the invention may also be embodied in various forms, and should not be limited to the embodiments described herein. Thicknesses, sizes or magnitudes of layers or regions in the drawings will be exaggerated for clarity's sake. The same or similar reference numbers indicate the same or similar components, which are not repeated in the following paragraphs.

Figure 2:
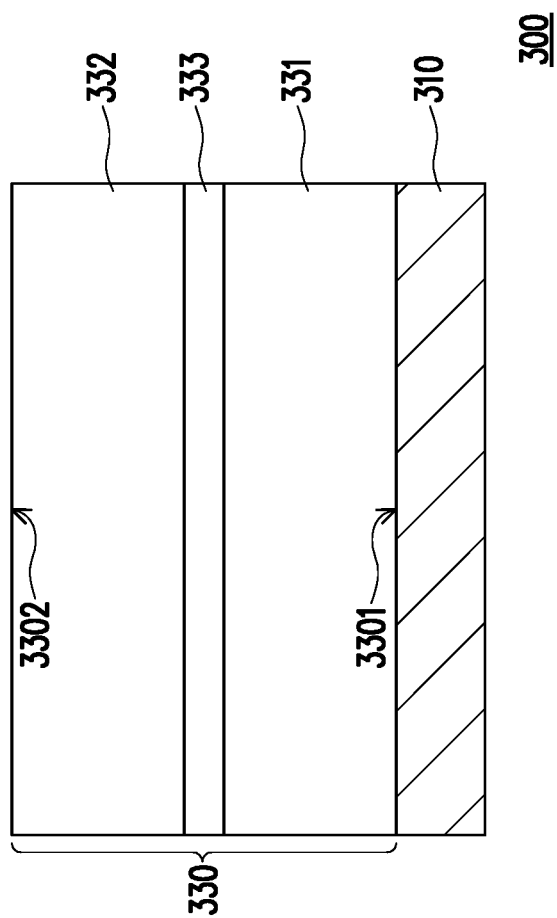
FIG. 2 is a schematic cross-sectional view of a light-emitting element according to an embodiment of the invention.
Figure 3A:
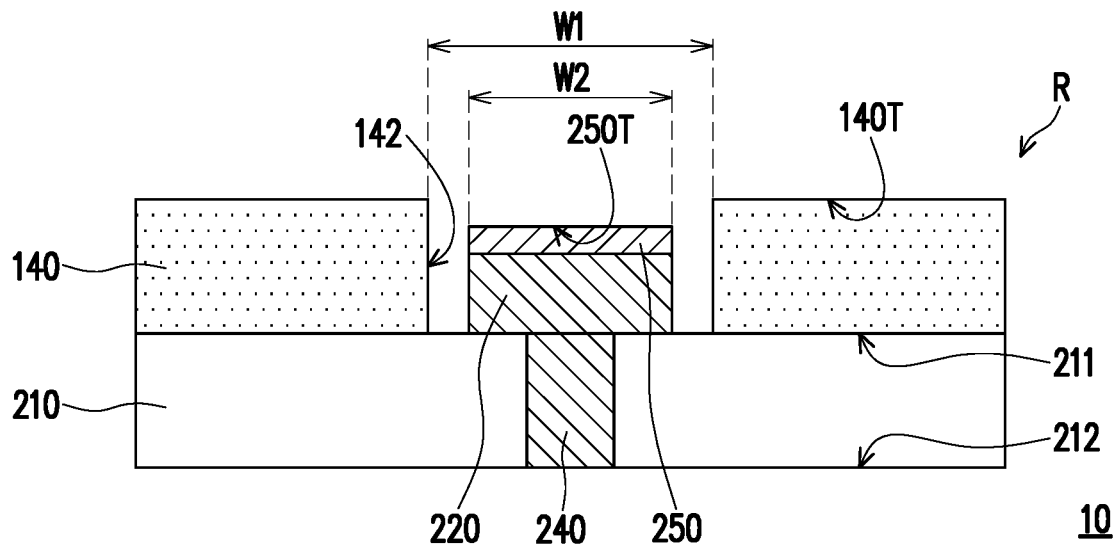
FIG. 3A is an enlarged schematic partial cross-sectional view of a region R of the light-emitting device in FIG. 1.

FIG. 1 is a schematic cross-sectional view of a light-emitting device according to an embodiment of the invention. FIG. 2 is a schematic cross-sectional view of a light-emitting element according to an embodiment of the invention. FIG. 3A is an enlarged schematic partial cross-sectional view of a region R of the light-emitting device in FIG. 1. For the sake of clarity of the drawings and convenience of description, several elements are omitted in FIG. 1, FIG. 2 and FIG. 3A. Referring to FIG. 1 first, the light-emitting device 10 includes a substrate 100, an insulating layer 120, an inner circuit structure 200, a plurality of light-emitting elements 300, an insulating encapsulation layer 150 and a transparent conductive layer 160. In the embodiment, the light-emitting device 10 is, for example, a light-emitting device using mini LEDs or micro LEDs. In the embodiment, the light-emitting device 10 includes a technological application as a light-emitting module or a display device, but the invention is not limited thereto.

In the embodiment, the light-emitting device 10 includes the substrate 100. The substrate 100 has an upper surface 101. A material of the substrate 100 includes a metal material, such as aluminum, copper, aluminum alloy, copper alloy, stainless steel or any material with good thermal conductivity, which is not limited by the invention. For example, the substrate 100 of the embodiment may be a copper plate, an aluminum plate or a stainless steel plate. In this way, the light emitting device 10 has good heat dissipation efficiency. In addition, the substrate 100 may also provide toughness and structural reliability, so that the light-emitting device 10 may have flexibility.

In some embodiments, the substrate 100 may also include a glass substrate, a printed circuit board (PCB board), or an active array substrate (for example, a thin film transistor (TFT) array substrate), or other suitable substrates, which is not limited by the invention.

As shown in FIG. 1, the insulating layer 120 is disposed on the upper surface 101 of the substrate 100. A method of forming the insulating layer 120 includes, for example, evaporating, sputtering, spin coating, or pressing. A material of the insulating layer 120 includes an organic material or an inorganic material. For example, the material of the insulating layer 120 may include a single-layer or multi-layer voltage-resistant insulating composite material or a viscous voltage-resistant polymer insulating composite material, but the invention is not limited thereto. In other embodiments, insulating layers may be provided on both of the upper surface 101 and the opposite lower surface of the substrate 100, but the invention is not limited thereto.

The inner circuit structure 200 is disposed on the insulating layer 120. In the embodiment, the inner circuit structure 200 is, for example, a double-sided copper foil substrate, but the invention is not limited thereto. For example, the inner circuit structure 200 includes a core layer 210, a first circuit layer 220, a second circuit layer 230, and a plurality of conductive vias 240. The core layer 210 has a first surface 211 and a second surface 212 opposite to the first surface 211. The first circuit layer 220 is disposed on the first surface 211. The second circuit layer 230 is disposed on the second surface 212. The plurality of conductive vias 240 are provided in the core layer 210 and penetrate through the core layer 210. The conductive vias 240 electrically connect the corresponding first circuit layer 220 and the second circuit layer 230. Under the above configuration, the inner circuit structure 200 may be a substrate with circuit patterns on both sides, but the invention is not limited thereto. In other embodiments, the inner circuit structure 200 may also only be a single-layer circuit substrate with a circuit layer provided on a single surface according to the designing needs of users.

In the embodiment, a material of the core layer 210 is, for example, an insulating substrate, including resin or a photoresist material, but the invention is not limited thereto. In some embodiments, the material of the core layer 210 may be similar to the material of the insulating layer 120, but the invention is not limited thereto.

Materials of the first circuit layer 220, the second circuit layer 230 and the conductive vias 240 are, for example, copper, nickel, palladium, gold, silver or alloys thereof, but the invention is not limited thereto. It should be noted that the invention is not limited to the structure shown in FIG. 1. In other embodiments, the first surface 211 and the second surface 212 of the core layer 210 may be respectively provided with multiple circuit build-up layers. Each circuit build-up layer may include a dielectric layer and a circuit layer. In this way, both surfaces of the inner circuit structure 200 may respectively include two, three, four or more layers of circuit layers to form a multilayer stacked inner circuit structure. In some other embodiments, the inner circuit structure 200 may also be a glass substrate, a PCB board or a thin film transistor array substrate, or other suitable substrates, which is not limited by the invention.

In the embodiment, the inner circuit structure 200 further includes at least one metal protection layer 250 correspondingly disposed on the first circuit layer 220. For example, the metal protection layer 250 is, for example, a protection layer formed on the first circuit layer 220 through an electroless nickel and immersion gold (ENIG) process. A material of the metal protection layer 250 includes aluminum, tin, nickel, gold or alloys thereof or other suitable materials, but the invention is not limited thereto. In this way, the metal protection layer 250 may achieve an effect of protecting the first circuit layer 220.

In the embodiment, the insulating layer 120 is disposed on the second surface 212 of the core layer 210, and the second circuit layer 230 is disposed in the insulating layer 120, but the invention is not limited thereto. In some embodiments, the second circuit layer 230 may also be disposed on the insulating layer 120. In other words, the second circuit layer 230 is substantially disposed between the insulating layer 120 and the core layer 210.

In the embodiment, the light-emitting device 10 further includes a patterned dielectric layer 140 disposed on the first surface 211. The patterned dielectric layer 140 has a plurality of openings 142. Each first circuit layer 220 and each metal protection layer 250 are correspondingly disposed in the corresponding opening 142. In the embodiment, a material of the patterned dielectric layer 140 may include silicone, epoxy, or acrylic resin, but the invention is not limited thereto.

Referring to FIG. 1 and FIG. 3A, FIG. 3A is a partial enlarged schematic diagram of the region R in FIG. 1. A width W1 of the opening 142 is greater than a width W2 of the first circuit layer 220 and/or the metal protection layer 250. The width W1 of the opening 142 may be defined as the maximum width of the opening 142. The width W2 of the first circuit layer 220 and/or the metal protection layer 250 may be defined as the maximum width of the first circuit layer 220 and/or the metal protection layer 250. In this way, there is a gap between an outer edge of the first circuit layer 220 and/or the metal protection layer 250 and an outer edge of the opening 142.

In the embodiment, a top surface 250T of the metal protection layer 250 is not aligned with a top surface 140T of the patterned dielectric layer 140, but the invention is not limited thereto.

Referring to FIG. 1, the light-emitting elements 300 are correspondingly disposed on the inner circuit structure 200. The light-emitting elements 300 are, for example, mini LEDs or micro LEDs, but the invention is not limited thereto. In some embodiments, the light-emitting elements 300 may also include LEDs or quantum dot (QD) LEDs. In the embodiment, the light-emitting elements 300 are, for example, vertical type LED.

In detail, any one of the light-emitting elements 300 includes a light-emitting structure 330 and a first electrode 310. The light-emitting structure 330 includes one surface 3301 and the other surface 3302 opposite to each other. The first electrode 310 is disposed on the one surface 3301 of the light-emitting structure 330. In the embodiment, the light-emitting element 300 is, for example, to electrically connect the first electrode 310 to the first circuit layer 220 of the inner circuit structure 200. Namely, the first electrode 310 is located between the light-emitting structure 330 and the inner circuit structure 200. In this embodiment, the first electrode 310 is, for example, an anode.

Referring to FIG. 1 and FIG. 2, in detail, the light-emitting structure 330 of the light-emitting device 300 includes a first type semiconductor layer 331, a second type semiconductor layer 332 and a light-emitting layer 333. The light-emitting layer 333 is located between the first type semiconductor layer 331 and the second type semiconductor layer 332.

The first type semiconductor layer 331 has the one surface 3301 of the light-emitting element 300, and the second type semiconductor layer 332 has the other surface 3302 of the light-emitting element 300. As shown in FIG. 2, the first electrode 310 is disposed on the one surface 3301 of the first type semiconductor layer 331.

In the embodiment, a conductivity type of the first type semiconductor layer 331 is different from a conductivity type of the second type semiconductor layer 332. For example, the first type semiconductor layer 331 may be made of a P-type doped semiconductor material, and the second type semiconductor layer 332 may be made of an N-type doped semiconductor material; and vice versa. In some embodiments, the N-type doped semiconductor material or the P-type doped semiconductor material includes gallium nitride (GaN), indium gallium nitride (InGaN), gallium arsenide (GaAs) or other materials composed of IIIA group and VA group elements or other suitable materials, but the invention is not limited thereto. The light-emitting layer 333, for example, has a quantum well (QW), such as a single quantum well (SQW), a multiple quantum well (MQW) or other quantum wells. Holes provided by the P-type doped semiconductor layer and electrons provided by the N-type doped semiconductor layer may be combined in the light-emitting layer 333 to release energy in the form of light.

Referring to FIG. 1, the light-emitting device 10 further includes a conductive adhesive layer 130. In the embodiment, the plurality of light-emitting elements 300 may be correspondingly fixed to the metal protection layer 250 on the first circuit layer 220 of the inner circuit structure 200 through the conductive adhesive layer 130. Under the above configuration, the conductive adhesive layer 130 may improve a bonding force and reliability between the light-emitting element 300 and the inner circuit structure 200. In addition, directly fixing the light-emitting element 300 onto the first circuit layer 220 through the conductive adhesive layer 130 may further simplify the manufacturing process.

In the embodiment, the insulating encapsulation layer 150 is disposed on the inner circuit structure 200. To be specific, the insulating encapsulation layer 150 is disposed on the patterned dielectric layer 140 and disposed in the openings 142 of the patterned dielectric layer 140. In the embodiment, a material of the insulating encapsulation layer 150 may include silicone, epoxy, or acrylic resin, but the invention is not limited thereto.

It should be noted that the insulating encapsulation layer 150 may cover a portion of the inner circuit structure 200 and encapsulate the plurality of light-emitting elements 300. As shown in FIG. 1, the insulating encapsulation layer 150 may also fill the gap between the first circuit layer 220 and the patterned dielectric layer 140 to contact and surround the first circuit layer 220 and the metal protection layer 250. In the embodiment, a top surface of the insulating encapsulation layer 150 may also be coplanar with the other surface 3302 of the light-emitting element 300 (for example, a top surface of the light-emitting element 300), but the invention is not limited thereto. Under the above configuration, the light-emitting element 300 may be disposed in the insulating encapsulation layer 150, thereby having good reliability and water oxygen resistance. In addition, the multiple light-emitting elements 300 may also be insulated from each other, thereby improving the process yield of the light-emitting device 10 and achieving good electrical quality.

In the embodiment, the transparent conductive layer 160 is disposed on the insulating encapsulation layer 150. The transparent conductive layer 160 may directly contact the other surface 3302 of the light-emitting element 300 to electrically connect the light-emitting element 300. In detail, the transparent conductive layer 160 may be entirely disposed on the insulating encapsulation layer 150 and cover the second type semiconductor layer 332 of the light-emitting element 300 (shown in FIG. 2). The transparent conductive layer 160 may also connect a plurality of light-emitting elements 300 in series. In this way, the transparent conductive layer 160 may be used as a common electrode. In addition, the transparent conductive layer 160 is, for example, used as a cathode of the light-emitting element 300.

In the embodiment, a material of the transparent conductive layer 160 may be a transparent conductive material, for example, indium tin oxide (ITO), but the invention is not limited thereto.

As shown in FIG. 1, the light-emitting device 10 further includes a passivation layer 180 disposed on the transparent conductive layer 160. Under the above configuration, the transparent conductive layer 160 and the light-emitting element 300 are located between the substrate 100 and the passivation layer 180. In this way, the passivation layer 180 may protect the transparent conductive layer 160 and the light-emitting element 300.

In some embodiment, a light conversion layer, a filter layer, a polarizing layer, a lens layer or other suitable optical film layers (not shown) may also be provided on the passivation layer 180, but the invention is not limited thereto. In other embodiments, the light conversion layer, the filter layer, the polarizing layer, the lens layer or the other suitable optical film layers may also be directly disposed on the transparent conductive layer 160, and the passivation layer 180 is omitted.

It should be noted that in the light-emitting device 10 of the embodiment, the first electrode 310 of the light-emitting element 300 is electrically connected to the first circuit layer 220 directly through the conductive adhesive layer 130. Then, the light-emitting element 300 is encapsulated and fixed on the inner circuit structure 200 through the insulating encapsulation layer 150. Afterwards, the plurality of light-emitting elements 300 are connected in series for conduction through the transparent conductive layer 160. In this way, the embodiment may avoid the problem of electrical anomaly caused by the ease of two electrodes contacting by conductive glue due to the distance between the two electrodes of the conventional light-emitting diode is too small.

In addition, the arrangement of the conductive adhesive layer 130 of the embodiment does not have the problem that the conventional electrodes are too small to cause alignment difficulty during dispensing, so that the manufacturing process difficulty may be reduced and the manufacturing process yield may be improved. In addition, directly encapsulating the light-emitting elements 300 in the insulating encapsulation layer 150 further simplifies the manufacturing process, and also ensures that the light-emitting elements 300 are insulated from each other. Thereby, improving the manufacturing process yield of the light-emitting device 10 and achieving good electrical quality.

Moreover, the light-emitting device 10 of the embodiment may further provide the transparent conductive layer 160 on the other surface 3302 of the light-emitting element 300 opposite to the first electrode 310. Therefore, there is no need to provide additional pads for bonding to the light-emitting element 300 through wire bonding process. In this way, a space required between the light-emitting elements 300 may be reduced, so as to further increase an arrangement density of the light-emitting elements 300. Therefore, the light-emitting quality of the light-emitting device 10 may be improved.

In addition, the light-emitting device 10 of the embodiment further has the substrate 100 made of a metal material. Therefore, besides that the light-emitting device 10 has good heat dissipation efficiency, the substrate 100 may further provide toughness and structural reliability, so that the light-emitting device 10 has flexibility.

It should be noted that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 3B:
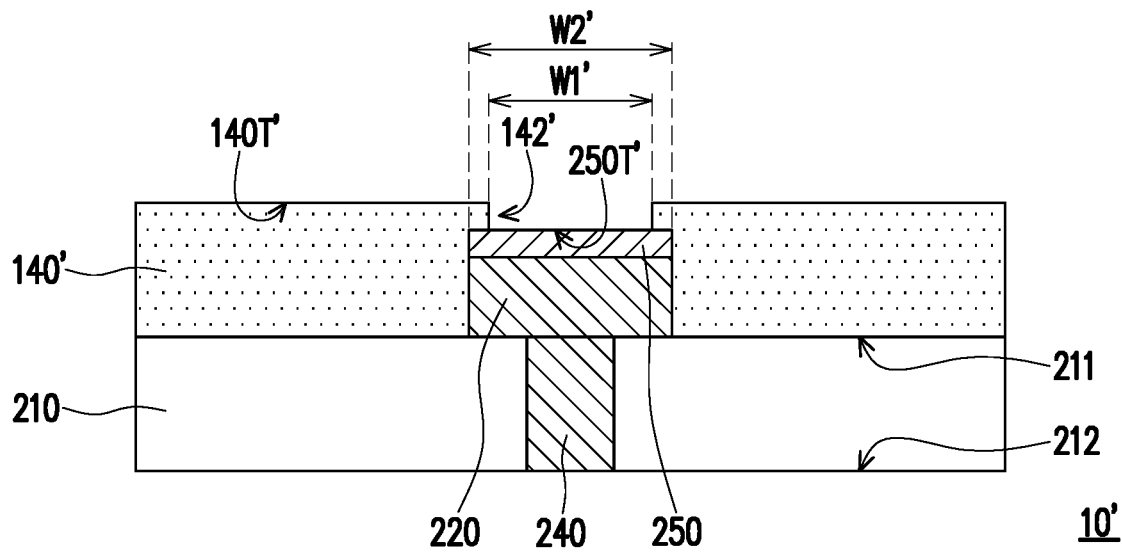
FIG. 3B is an enlarged schematic partial cross-sectional view of a light-emitting device according to another embodiment of the invention.

FIG. 3B is an enlarged schematic partial cross-sectional view of a light-emitting device according to another embodiment of the invention. Referring to FIGS. 3A and 3B, a light-emitting device 10' of the embodiment is similar to the light-emitting device 10 of FIG. 3A, and a main difference is that in the embodiment, a part of a patterned dielectric layer 140' may cover a part of the first circuit layer 220 and/or the metal protection layer 250. For example, an outer edge of an opening 142' of the patterned dielectric layer 140' may be within the outer edge of the first circuit layer 220. In other words, the first circuit layer 220 may be surrounded by the patterned dielectric layer 140', and a part of the patterned dielectric layer 140' may cover a part of a top surface 250T' of the metal protection layer 250. The opening 142' exposes the other part of the top surface 250T' of the metal protection layer 250.

In the embodiment, a width W1' of the opening 142' is smaller than a width W2' of the first circuit layer 220 and/or the metal protection layer 250. In this way, the outer edge of the first circuit layer 220 and/or the metal protection layer 250 may directly contact the patterned dielectric layer 140'. In addition, the top surface 250T' of the metal protection layer 250 is not aligned with a top surface 140T' of the patterned dielectric layer 140', but the invention is not limited thereto. In this way, the light-emitting device 10' may obtain the same effect as that of the aforementioned embodiment.

Figure 3C:
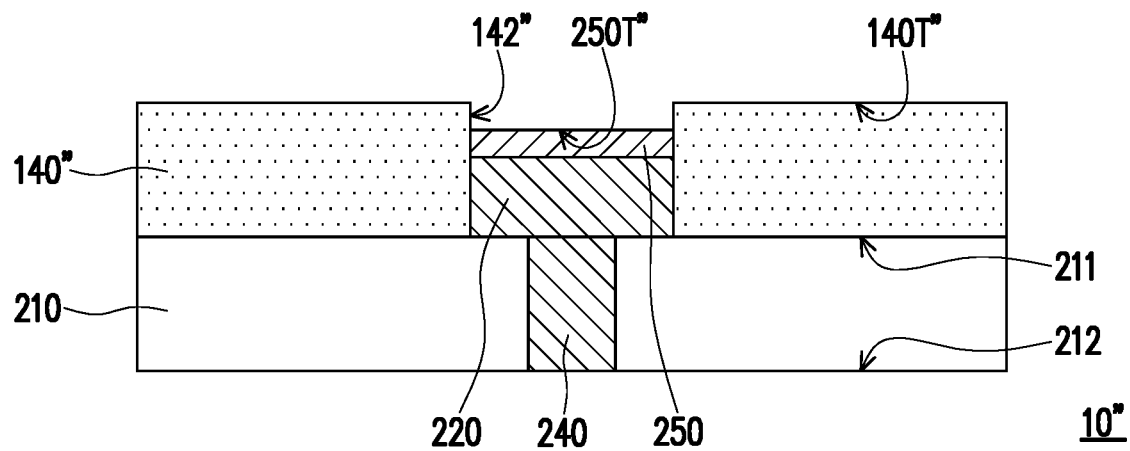
FIG. 3C is an enlarged schematic partial cross-sectional view of a light-emitting device according to still another embodiment of the invention.

FIG. 3C is an enlarged schematic partial cross-sectional view of a light-emitting device according to still another embodiment of the invention. Referring to FIGS. 3C and 3A, a light-emitting device 10" of the embodiment is similar to the light-emitting device 10 of FIG. 3A, and a main difference is that: in the embodiment, a patterned dielectric layer 140" may surround the outer edge of the first circuit layer 220 and/or the metal protection layer 250. For example, an outer edge of an opening 142" of the patterned dielectric layer 140" may contact the outer edge of the first circuit layer 220. In other words, a width of the opening 142" is substantially the same as a width of the first circuit layer 220 and/or the metal protection layer 250.

In addition, a top surface 2501" of the metal protection layer 250 is not horizontally aligned with a top surface 140T" of the patterned dielectric layer 140", but the invention is not limited thereto. In this way, the light-emitting device 10" may obtain the same effect as that of the aforementioned embodiment.

Figure 4:
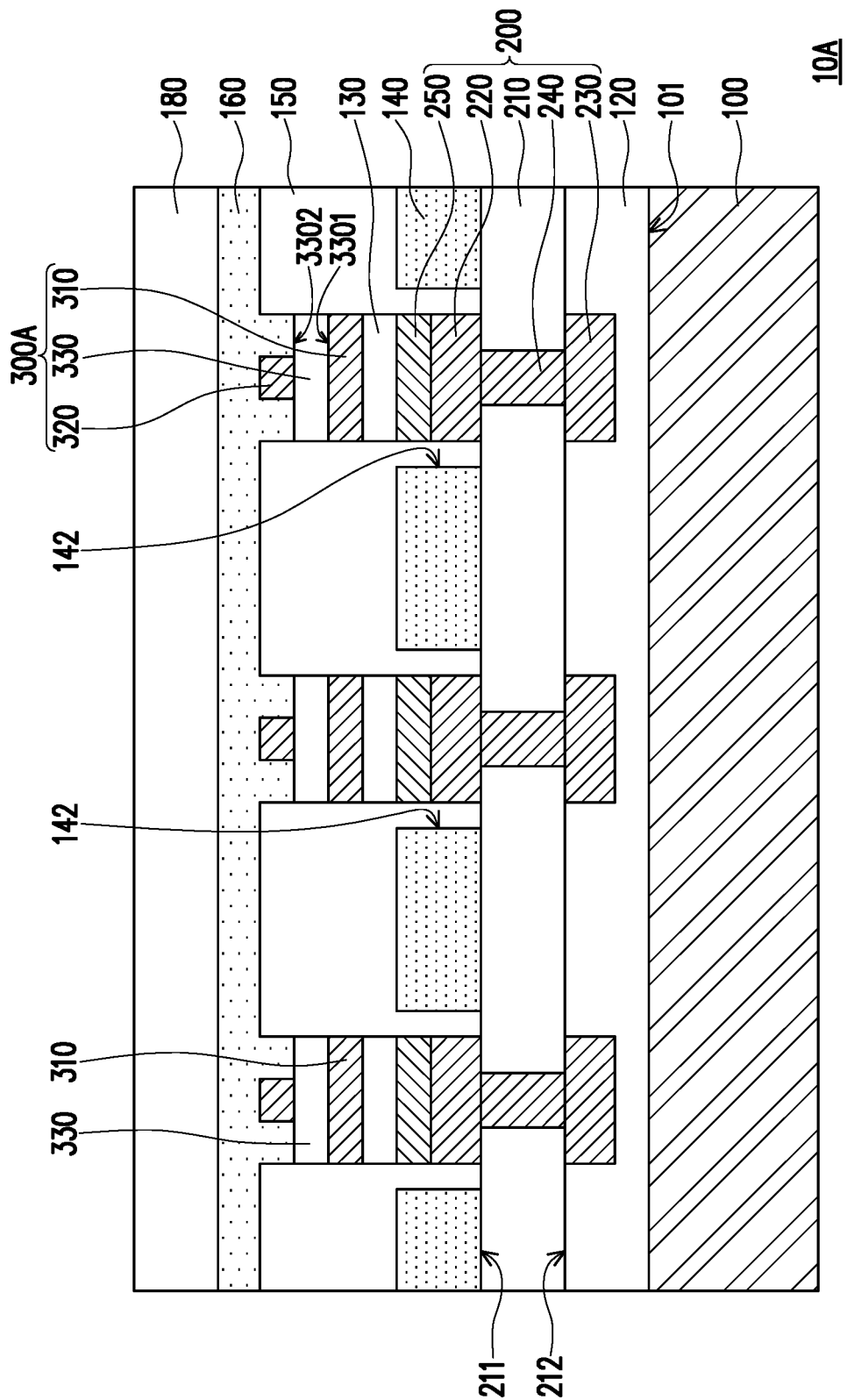
FIG. 4 is a schematic cross-sectional view of a light-emitting device according to another embodiment of the invention.

FIG. 4 is a schematic cross-sectional view of a light-emitting device according to another embodiment of the invention. Referring to FIG. 1 and FIG. 4, a light-emitting device 10A of the embodiment is similar to the light-emitting device 10 of FIG. 1, and a main difference is that: in the embodiment, any one of a plurality of light-emitting elements 300A further includes a second electrode 320. For example, the light-emitting element 300A is an LED with electrodes provided on two opposite surfaces of the light-emitting structure 330. As shown in FIG. 4, the light-emitting structure 330 is disposed between the first electrode 310 and the second electrode 320. The first electrode 310 is disposed on the one side 3301, and is electrically connected to the first circuit layer 220 through the conductive adhesive layer 130. The second electrode 320 is disposed on the other side 3302 of the light-emitting structure 330 relative to the first electrode 310, and is electrically connected to the transparent conductive layer 160.

In the embodiment, the second electrode 320, for example, contacts the second type semiconductor layer 332 (shown in FIG. 2). For example, the second electrode 320 may correspond to the second type semiconductor layer 332 (for example, the N type), and may be a cathode. Under the above configuration, the second electrode 320 may further reduce a resistance between the light-emitting element 300A and the transparent conductive layer 160, thereby improving the light-emitting efficiency of the light-emitting element 300A. In addition, the light-emitting device 10A may also obtain the same effects as that of the aforementioned embodiment.

Figure 5:
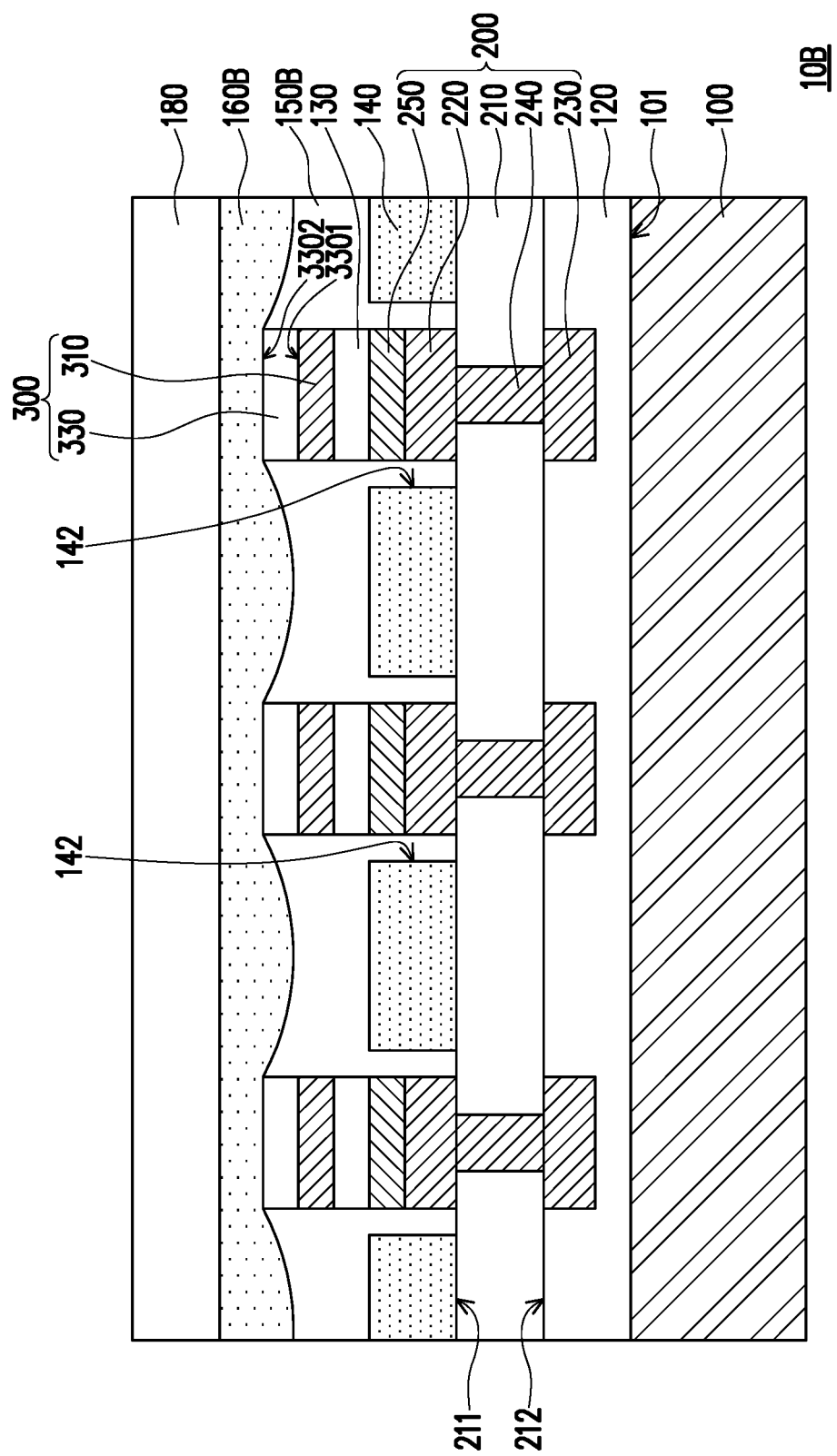
FIG. 5 is a schematic cross-sectional view of a light-emitting device according to still another embodiment of the invention.

FIG. 5 is a schematic cross-sectional view of a light-emitting device according to still another embodiment of the invention. Referring to FIG. 1 and FIG. 5, a light-emitting device 10B of the embodiment is similar to the light-emitting device 10 of FIG. 1, and a main difference is that: in the embodiment, a junction of an insulating encapsulation layer 150B and a transparent conductive layer 160B may be an uneven wave shape in a cross-sectional view. For example, a top surface of the insulating encapsulation layer 150B between two adjacent light-emitting elements 300 may gradually approach the inner circuit structure 200 from a place where it contacts the light-emitting element 300 to a midpoint between the two adjacent light-emitting elements 300, and then gradually move away from the inner circuit structure 200 from the aforementioned midpoint to the light-emitting element 300. In this way, the insulating encapsulation layer 150B may form a concave arc-shaped top surface between two adjacent light-emitting elements 300. The transparent conductive layer 160B is disposed on the insulating encapsulation layer 150B and is conformal to the arc-shaped top surface. Therefore, a bottom surface of the transparent conductive layer 160B may be complementary to the arc-shaped top surface of the insulating encapsulation layer 150B, and has a wave shape cross-section. Therefore, the transparent conductive layer 160B may completely cover the insulating encapsulation layer 150B to provide a good electrical connection to the light-emitting elements 300. In addition, the light-emitting device 10B may also obtain the same effects as that of the aforementioned embodiment.

Figure 6:
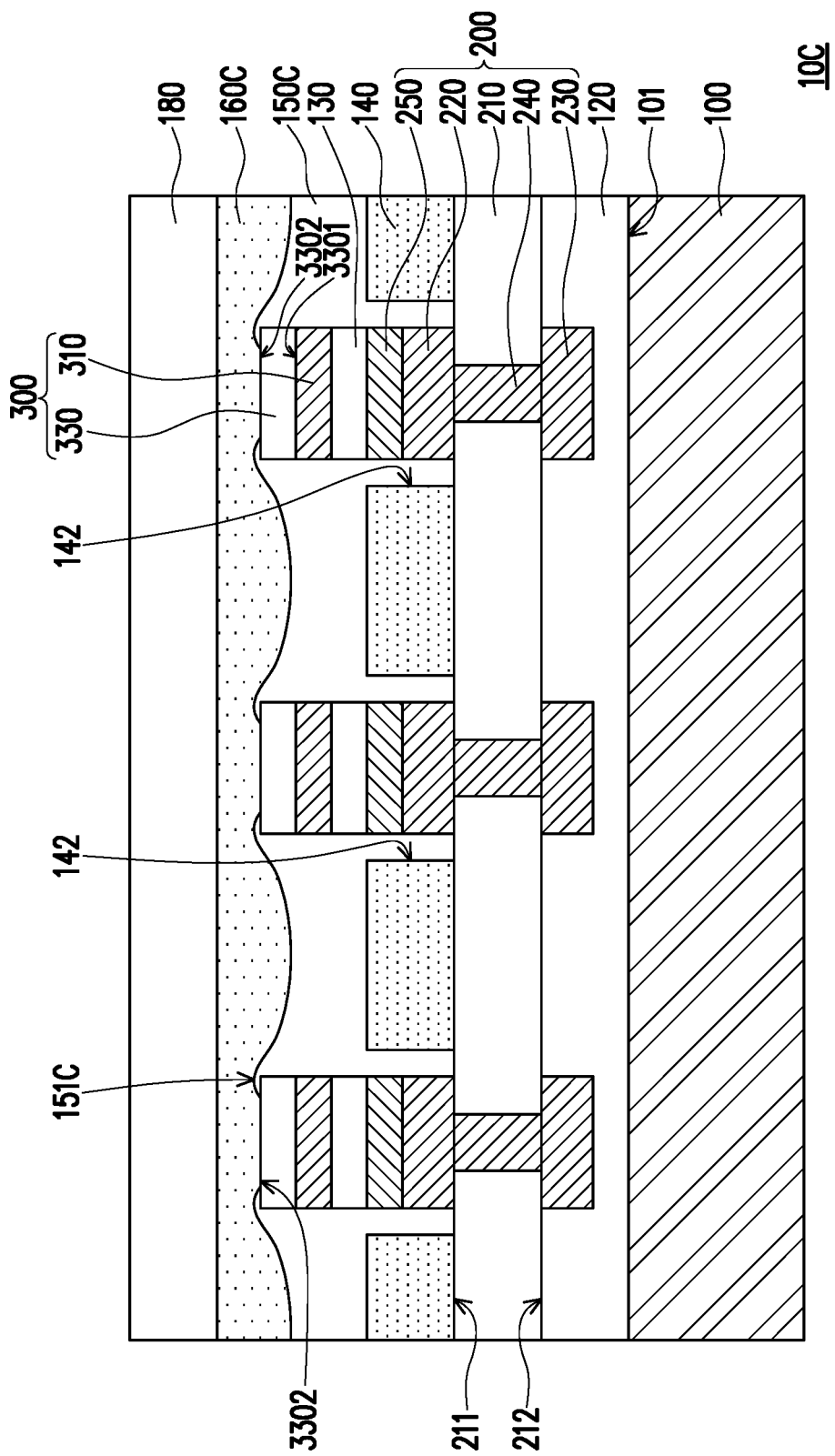
FIG. 6 is a schematic cross-sectional view of a light-emitting device according to still another embodiment of the invention.

FIG. 6 is a schematic cross-sectional view of a light-emitting device according to still another embodiment of the invention. Referring to FIG. 5 and FIG. 6, a light-emitting device 10C of the embodiment is similar to the light-emitting device 10B of FIG. 5, and a main difference is that: portions of the insulating encapsulation layer 150C are disposed on the surface 3302 close to the outer edge of the light-emitting structure 330 (e.g. the top surface of the light-emitting structure 330). In the manufacturing process of some of the embodiments, during the formation of the insulating encapsulation layer 150C, due to the technology or margin tolerance of the manufacturing process, it may be possible for the portions the insulating encapsulation layer 105C to form and cover portions of the surface 3302 of the light-emitting structure 330. The portions of the insulating encapsulation layer 150C covering the light-emitting structure 300 may be defined as protrusions 151C of the insulating encapsulation layer 150C. In other words, the protrusions 151C may overlap the portions of the light-emitting structure 330 on a normal direction of the substrate 100. In some embodiments, the protrusions 151C include a sloped circular arc. That is to say, the protrusions 151C may increase in thickness from the point of contacting the light-emitting structure 300 and close to the center of the surface 3302 towards the outer edge of the light-emitting structure 300. Then, the top surface of the insulating encapsulation layer 150C gradually moves towards the inner circuit structure 200 from the location where the protrusions 151C connects the top surface of the insulating encapsulation layer 150C close to the outer edge towards the midpoint between the two adjacent light-emitting elements 300. Thereby, a cross-section of the protrusions 151C and the insulating encapsulation layer 150C may form a smiling curve between the adjacent two light-emitting structures 330, but not limited thereto. In some other embodiments, the cross-section of the insulating encapsulation layer 150C may be a bulge between the adjacent two light-emitting structures 330. According to the above, the light-emitting device 10C may also obtain the same effects as that of the aforementioned embodiment.

Figure 7:
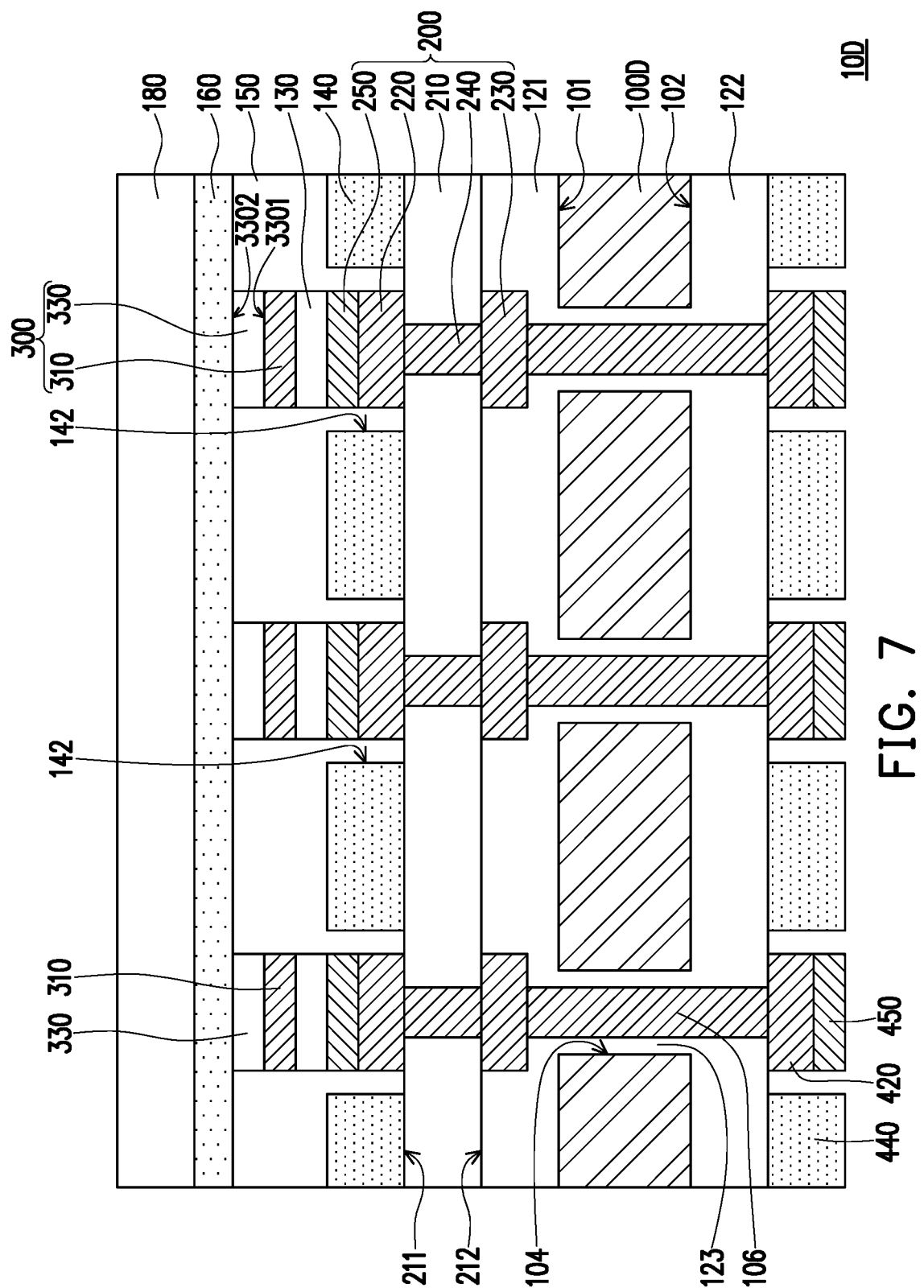
FIG. 7 is a schematic cross-sectional view of a light-emitting device according to still another embodiment of the invention.

FIG. 7 is a schematic cross-sectional view of a light-emitting device according to still another embodiment of the invention. Referring to FIG. 1 and FIG. 7, a light-emitting device 10D of the embodiment is similar to the light-emitting device 10 of FIG. 1, and a main difference is that: the substrate 100D is, for example, a circuit board having a through via penetrating the substrate 100D. In detail, in the normal direction of the substrate 100D, the substrate 100D includes a plurality of openings penetrating the substrate 100D. The openings of the substrate 100D are disposed corresponding to the second circuit layer 230, but not limited thereto. Conductive through vias 106 penetrating the substrate 100D are disposed in the openings of the substrate 100D respectively. In some embodiments, the openings and the conductive through vias 106 therein correspond to the second circuit layer 230, but not limited thereto. In some embodiments, the substrate 100D may be made of a metal material or an insulating material. In some embodiments, the substrate 100D may include a glass substrate, a thin film transistor array substrate, a PCB board, a flexible substrate or an organic substrate, but not limited thereto. The conductive through via 106 may include a conductive material, but not limited thereto. In some embodiments, the light-emitting device 10D further includes a second insulating layer 122 disposed on a lower surface 102 of the substrate 100D. For example, insulating layers may be provided on the upper surface 101 and the lower surface 102 of the substrate 100D. The lower surface 102 is opposite to the upper surface 101. The first insulating layer 121 (such as the corresponded insulating layer 120 in FIG. 1) is disposed on the upper surface 101, and the second insulating layer 122 is disposed on the lower surface 102 opposite to the first insulating layer 121. So as to have the substrate 100D being disposed between the first insulating layer 121 and the second insulating layer 122. A portion of the first insulating layer 121 and a portion of the second insulating layer 122 fill into the openings of the substrate 100D and form insulating material 123 on inner sidewalls of the opening so as to surround the conductive through via 106. In other embodiments, the insulating material 123 may also fill into the opening in another step independently, and not be integrally formed with the first insulating layer 121 or the second insulating layer 122, but not limited thereto. The materials of the first insulating material 121, the second insulating material 122 and the insulating material 123 may be the same or different material as the insulating material 120, and is not repeated herein.

In some embodiments, the light-emitting device 10D further includes a third circuit layer 420. The third circuit layer 420 is disposed on the second insulating layer 122 (such as on a bottom surface of the second insulating layer 122). The material of the third circuit layer 420 may be the same or different from the materials of the first circuit layer 220, the second circuit layer 230, and the vias 240, and is not repeated herein. In some embodiments, the light-emitting device 10D further includes a metal protection layer 450 correspondingly disposed on the third circuit layer 420, such as on a bottom surface of the third circuit layer 420. The materials of the metal protection layer 450 may be the same or different from the materials of the metal protection later 250, and is not repeated herein.

In the embodiment, the light-emitting device 10D further includes a patterned dielectric layer 440. The patterned dielectric layer 440 is disposed on the second insulating layer 122, such as on the bottom surface of the second insulating layer 122. For example, the patterned dielectric layer 440 is disposed on the entire bottom surface of the second dielectric layer 122. The patterned dielectric layer 440 has a plurality of openings. The third circuit layer 420 and the metal protection 450 are correspondingly disposed in the openings. In some embodiments, the materials of the patterned dielectric layer 440 may be the same or different from the materials of the patterned dielectric layer 140, and is not repeated herein.

Under the above configuration, the conductive through via 106 electrically connects the second circuit layer 230 of the inner circuit structure 200 and the third circuit layer 420. Thereby, the light-emitting device 10D may further guide the circuits of the inner circuit structure 200 from the upper surface 101 to the third circuit layer 420 on the lower surface 102 of the substrate 100D. In this way, the light-emitting device 10D may couple to external circuit devices on the lower surface 102 of the substrate 100D (such as the back surface of the substrate), so as to further provides diverse manners in circuit connection. In addition, the light-emitting device 10D may also obtain the same effects as that of the aforementioned embodiment.

Figure 8:
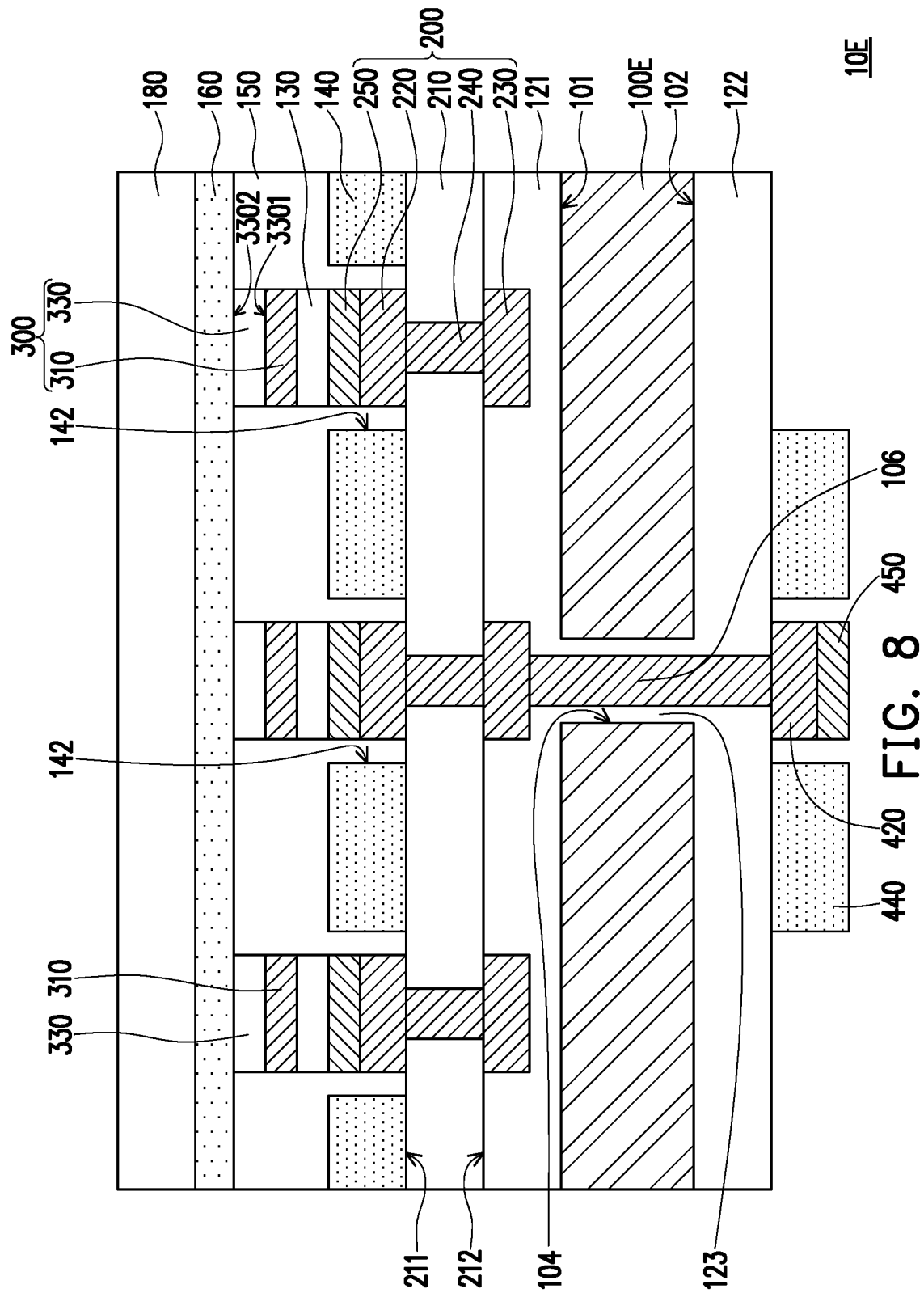
FIG. 8 is a schematic cross-sectional view of a light-emitting device according to still another embodiment of the invention.

FIG. 8 is a schematic cross-sectional view of a light-emitting device according to still another embodiment of the invention. Referring to FIG. 7 and FIG. 8, a light-emitting device 10E of the embodiment is similar to the light-emitting device 10D of FIG. 7, and a main difference is that: the opening penetrating through the substrate 100E and the conductive through via 106 disposed therein may be singular or plural. The opening and the conductive through via 106 are disposed and corresponded to a portion of the second circuit layer 230. In other words, the opening and the conductive through via 106 disposed therein are disposed in a portion of the area of the substrate 100E, and the opening and the conductive through via 106 correspond to the portion of the second circuit layer 230. In this way, only a portion of the second circuit layer 230 is electrically connected to the third circuit layer 420 through the conductive through via 106. Thereby, the manufacturing cost can be reduced, and the manufacturing process can be simplified. In addition, the patterned dielectric layer 440 may only be disposed around the third circuit layer 420, and is not disposed on the entire lower surface of the second dielectric layer 122. In other words, the patterned dielectric layer 440 may only be disposed on a portion of the lower surface of the second dielectric layer 122. Thereby, the light-emitting device 10E may also obtain the same effects as that of the aforementioned embodiment.

In summary, in the light-emitting device of an embodiment of the invention, the first electrode of the light-emitting element is directly electrically connected to the first circuit layer of the inner circuit layer through the conductive adhesive layer. Then, the light-emitting elements are encapsulated and fixed on the inner circuit structure through the insulating encapsulation layer. The transparent conductive layer electrically and serially connects the light-emitting elements. In this way, the light-emitting device may avoid the problem of electrical anomaly due to excessive smallness of LED electrodes. In addition, the light-emitting device of the embodiment directly encapsulates the light-emitting elements in the insulating encapsulation layer and fixes the same to the inner circuit structure, thereby reducing the process difficulty and improving the manufacturing yield. Moreover, the light-emitting elements are ensured to be insulated from each other, thereby improving the process yield of the light-emitting device and achieve good electrical quality.

In addition, the light-emitting device of the embodiment may further connect multiple light-emitting elements in series through the transparent conductive layer 160, so there is no need to bond additional pads through wire bonding. Therefore, the space required between the light-emitting elements may be reduced, so as to further increase the arrangement density of the light-emitting elements. Therefore, the light-emitting quality of the light-emitting device may be improved. In addition, the light-emitting device of the embodiment surface has a substrate made of a metal material and disposed on the inner circuit structure. Therefore, in addition to the good heat dissipation efficiency of the light-emitting device, the substrate may further provide toughness and structural reliability, so that the light-emitting device has flexibility. In addition, the inner circuit structure of the light-emitting device may also have a multi-layer circuit build-up layers to further increase a space margin of circuit wiring. In addition, the substrate also has the conductive through vias penetrating through the substrate, so as to geode the circuits from the upper surface to the circuits on the lower surface. Thereby, the light-emitting device further provides diverse manners in circuit connection.

What is claimed is:

1. A light-emitting device, comprising:
   a substrate, wherein the substrate comprises a conductive through via penetrating through the substrate;
   a first insulating layer, disposed on the substrate;
   a second insulating layer disposed on a lower surface of the substrate opposite the first insulating layer;
   a third circuit layer disposed under the second insulating layer;
   an inner circuit structure, disposed on the first insulating layer;
   a plurality of light-emitting elements, correspondingly disposed on the inner circuit structure;
   an insulating encapsulation layer, disposed on the inner circuit structure, and the insulating encapsulation layer covering a portion of the inner circuit structure and encapsulating the light-emitting elements; and
   a transparent conductive layer, disposed on the insulating encapsulation layer, the transparent conductive layer electrically connecting the light-emitting elements, and serially connecting the light-emitting elements,
   wherein the conductive through via electrically connects the inner circuit structure and the third circuit layer.

2. The light-emitting device as claimed in claim 1, wherein any of the light-emitting elements comprises:
   a light-emitting structure; and
   a first electrode, disposed on one surface of the light-emitting structure, the first electrode being located between the light-emitting structure and the inner circuit structure, and the first electrode being electrically connected to the inner circuit structure.

3. The light-emitting device as claimed in claim 2, wherein any of the light-emitting elements further comprises:
   a second electrode, disposed on another surface of the light-emitting structure relative to the first electrode,
   wherein the second electrode is electrically connected to the transparent conductive layer.

4. The light-emitting device as claimed in claim 1, further comprising a conductive adhesive layer, the conductive adhesive layer correspondingly fixing each of the light-emitting elements to the inner circuit structure.

5. The light-emitting device as claimed in claim 1, further comprising a passivation layer disposed on the transparent conductive layer, wherein the transparent conductive layer and the light-emitting elements are located between the substrate and the passivation layer.

6. The light-emitting device as claimed in claim 1, wherein the inner circuit structure comprises:
   a core layer, having a first surface and a second surface opposite to the first surface;
   a first circuit layer, disposed on the first surface;
   a second circuit layer, disposed on the second surface; and
   a conductive via, disposed in the core layer, and the conductive via being electrically connected to the first circuit layer and the second circuit layer.

7. The light-emitting device as claimed in claim 6,
   wherein the first circuit layer is electrically connected to the light-emitting elements, and the second circuit layer is disposed between the first insulating layer and the core layer.

8. The light-emitting device as claimed in claim 6, wherein the inner circuit structure further comprises at least one metal protection layer correspondingly disposed on the first circuit layer.

9. The light-emitting device as claimed in claim 6, further comprising a patterned dielectric layer disposed on the first surface, wherein the patterned dielectric layer has a plurality of openings, and the first circuit layer is correspondingly disposed in the openings.

10. The light-emitting device as claimed in claim 9, wherein the insulating encapsulation layer is disposed on the patterned dielectric layer, and disposed in the openings.

\* \* \* \* \*